(12) United States Patent
Park

(10) Patent No.: US 7,868,368 B2
(45) Date of Patent: Jan. 11, 2011

(54) COMPLEMENTARY METAL OXIDE SEMICONDUCTOR (CMOS) IMAGE SENSOR

(75) Inventor: Dong Bin Park, Daejeon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 12/544,426

(22) Filed: Aug. 20, 2009

(65) Prior Publication Data

US 2009/0302361 A1 Dec. 10, 2009

Related U.S. Application Data

(62) Division of application No. 11/614,100, filed on Dec. 21, 2006, now Pat. No. 7,595,215.

(30) Foreign Application Priority Data

Dec. 29, 2005 (KR) .................. 10-2005-0133167

(51) Int. Cl.
*H01L 31/113* (2006.01)
(52) U.S. Cl. ............... 257/294; 257/290; 257/293; 257/432; 257/E21.001

(58) Field of Classification Search ......... 257/290–295; 438/48, 69–70
See application file for complete search history.

(56) References Cited

U.S. PATENT DOCUMENTS

| 7,078,779 | B2 | 7/2006 | Wang et al. |
| 7,579,639 | B2 * | 8/2009 | Jung .................. 257/294 |
| 2006/0033131 | A1 | 2/2006 | Kim |

FOREIGN PATENT DOCUMENTS

| JP | 04-263574 | 4/1994 |
| JP | 04-310267 | 6/1994 |

* cited by examiner

*Primary Examiner*—Dung A. Le
(74) *Attorney, Agent, or Firm*—Saliwanchik, Lloyd & Saliwanchik

(57) ABSTRACT

A CMOS image sensor and a method for manufacturing the same are provided. The CMOS image sensor enlarges an area of a real image and prevents interference between adjacent pixels by forming a plurality of microlenses on a convex surface and forming a light blocking layer in the space between each of color filters. The CMOS image sensor can include photodiodes, a first planarization layer, R, G, B color filter layers, a second planarization layer having holes filled with a light blocking layer, and a plurality of microlenses.

4 Claims, 4 Drawing Sheets

COMPLEMENTARY METAL OXIDE SEMICONDUCTOR (CMOS) IMAGE SENSOR

CROSS-REFERENCE TO RELATED APPLICATIONS

This application is a divisional of U.S. application Ser. No. 11/614,100, filed Dec. 21, 2006, now U.S. Pat. No. 7,595,215 which claims the benefit under 35 U.S.C. §119(e) of Korean Patent Application No. 10-2005-0133167 filed Dec. 29, 2005, which are incorporated herein by reference in their entirety.

FIELD OF THE INVENTION

The present invention relates to an image sensor, and more particularly, to a CMOS image sensor enlarging an area of a real image that can be captured, and a method for manufacturing the same.

BACKGROUND OF THE INVENTION

Generally, an image sensor is a semiconductor device for converting an optical image into an electrical signal, and is largely classified as a charge coupled device (CCD) image sensor or a complementary metal oxide semiconductor (CMOS) image sensor.

The CMOS image sensor includes a photodiode unit for detecting incident light, and a CMOS logic circuit for generating data by processing the detected light into an electric signal. As the amount of light received in the photodiode increases, the photosensitivity of the image sensor improves.

In order to improve photosensitivity of an image sensor, one method uses a technology for increasing the ratio (a fill factor) of the area occupied by a photodiode to the total area of the image sensor; and another method uses a light condensing technology, which changes an optical path of light incident on an area outside a photodiode in order to condense the light into the photodiode.

A typical example of a light condensing technology is to form microlenses. According to this technology, the microlenses are formed of a material having excellent light transmittance on an upper surface of a photodiode. The microlens is formed in a convex shape. This is to refract a path of the incident light such that a larger amount of light is projected into a photodiode region.

Hereinafter, a related art CMOS image sensor is described with reference to FIG. 1.

FIG. 1 is a sectional view of the related art CMOS image sensor.

The related art CMOS sensor, as illustrated in FIG. 1, includes photodiodes 12, a first planarization layer 13, red (R), green (G), and blue (B) color filter layers 14, a second planarization layer 15, and a microlens 16. In particular, at least one photodiode 12 is formed in the surface of a semiconductor substrate 11 to generate electric charges according to an amount of incident light. The first planarization layer 13 is formed on an entire surface of the semiconductor substrate 11 including photodiodes 12. The R, G, B color filter layers 14 are formed on the first planarization layer 13 to transmit light in each specific wavelength range. The color filter layers 14 are formed with a predetermined interval between each color filter. The second planarization layer 15 is formed on an entire surface of the semiconductor substrate 11 having the R, G, B color filter layers 14. The microlens is formed on the second planarization layer 15 in a convex shape having a predetermined curvature to condense light that transmits to a corresponding R, G, B color filter 14.

Here, the microlens 16 is formed of polymer-based resin, and shaped to have the predetermined curvature and size by first patterning the polymer-based resin through deposition, exposure, and development process, and then reflowing the patterned polymer-based resin by a process such as a reflow process.

That is, the optimized size, thickness, and curvature diameter of the microlens 16 are determined by the size, position, and shape of a unit pixel, the thickness of the photosensitive device, and the height, position, and size of a light blocking layer.

At this point, a shape of the pattern profile may change according to exposure conditions.

For example, process progressing conditions may change according to a thin film condition in a semiconductor substrate. In reality, the pattern formation condition is very unstable, thereby deteriorating light condensing efficiency.

The microlens 16 is formed to increase the light condensing efficiency in a process for manufacturing the related art CMOS image sensor. The microlens 16 is a very important factor determining image sensor characteristics.

The microlens 16 serves to condense a larger amount of light into the photodiode 12 through each color filter layer 14 according to a wavelength when natural light is projected onto the image sensor.

The light incident to the image sensor is condensed by the microlens 16, and the light filtered through the color filter layers 14 is incident into the photodiode 12 corresponding to the color filter layers 14 below the photodiode 12.

The related art CMOS image sensor has a following problem.

That is, since the color filter layers 14 have respective different thickness according to the filter color type, height difference occurs. To resolve this problem, the thickness of the second planarization layer 15 is formed to be more than half of the thickness of the color filter layer after forming the color filter layers 14.

Since the microlens is formed on the second planarization layer 15 having a plane shape, the range of a real image that can be captured is limited.

Additionally, light may be incident into adjacent pixels through the color filter layers 14 having a predetermined interval therebetween. Therefore, crosstalk may occur and image sensor characteristics may deteriorate.

BRIEF SUMMARY

Accordingly, embodiments of the present invention are directed to a CMOS image sensor and a method for manufacturing the same that substantially obviates one or more problems due to limitations and/or disadvantages of the related art.

An object of embodiments of the present invention is to provide a CMOS image sensor enlarging an area of a real image and preventing interference between adjacent pixels, and a method for manufacturing the same.

Another object of embodiments of the present invention is to provide a microlens formed on a convex shaped planarization layer.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a complementary metal oxide semiconductor image sensor including: a plurality of photodiodes formed in the surface of a semiconductor substrate; a first planarization layer formed on the entire surface of the semiconductor substrate having the photodiodes; color filter layers formed on the first planarization layer corresponding to each of the photodiodes, the color filter layers being spaced apart from each other by a predetermined interval; a second planarization layer formed in a convex shape on the entire surface of the semiconductor substrate having the color filter layers; and a plurality of microlenses formed on the second planarization layer to correspond to the color filter layers.

In another aspect of the present invention, there is provided a method of manufacturing a complementary metal oxide semiconductor image sensor, the method including: forming a first planarization layer on a semiconductor substrate having a plurality of photodiodes; forming color filter layers on the first planarization layer to correspond to the photodiodes, the color filter layers being spaced apart from each other by a predetermined interval; forming a second planarization layer on the entire surface of the semiconductor substrate having the color filter layers; shaping a surface of the second planarization layer to a convex form; forming a hole by selectively removing the second planarization layer to expose space between each of the color filter layers; forming a light blocking layer by filling the hole with a light blocking material; and forming a plurality of microlenses on the convex shaped second planarization layer with the light blocking layer, each microlens corresponding to one of the color filter layers.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION

Reference will now be made in detail to the preferred embodiments of the present invention, examples of which are illustrated in the accompanying drawings.

Figure 1:
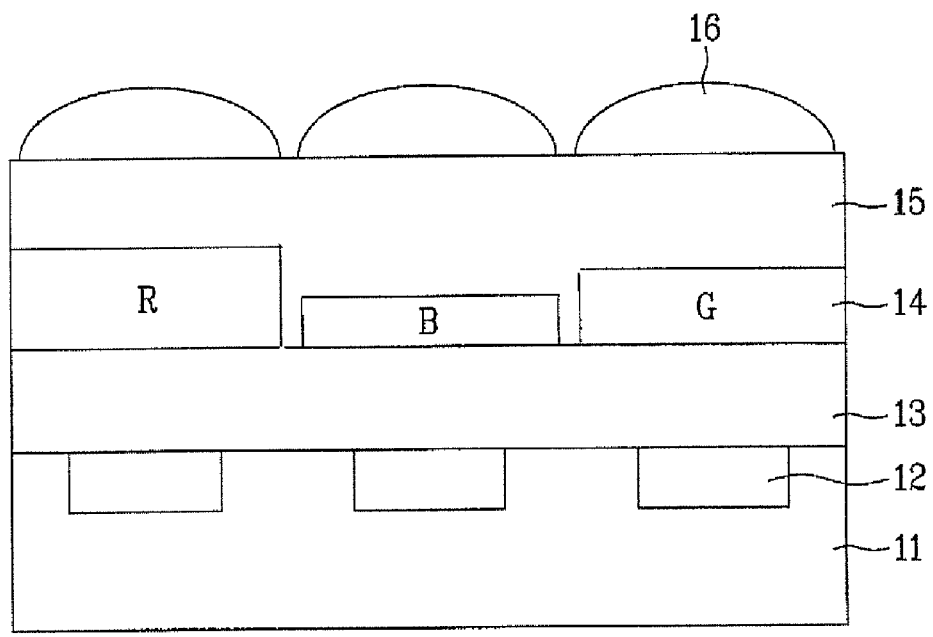
FIG. 1 is a sectional view of a related art CMOS image sensor.
Figure 2:
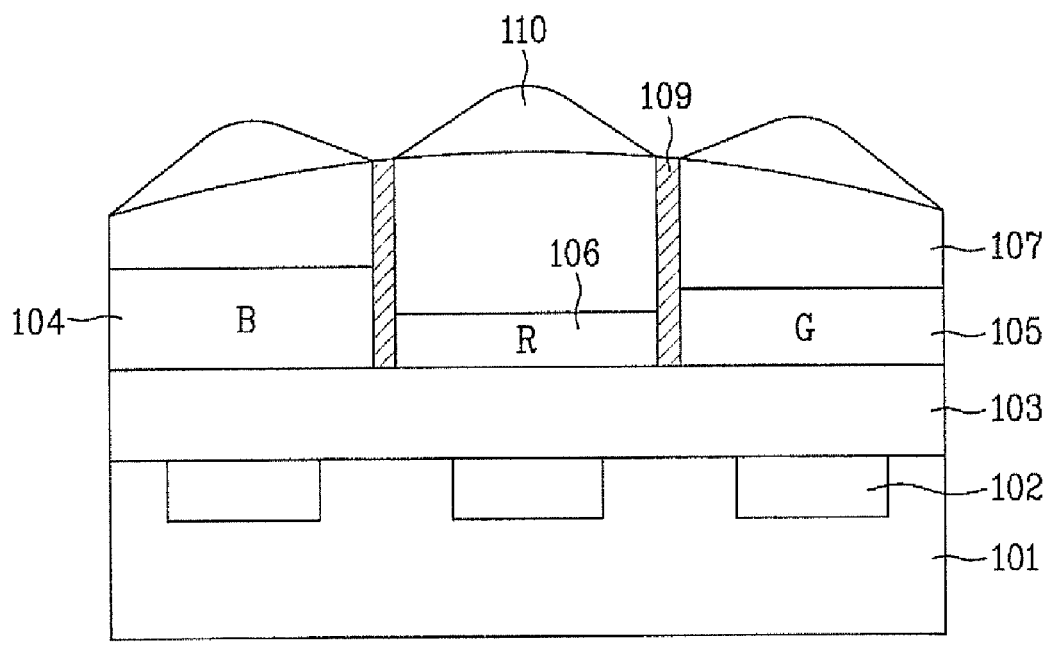
FIG. 2 is a sectional view of a CMOS image sensor according to a first embodiment of the present invention.

FIG. 2 is a sectional view of a CMOS image sensor according to a first embodiment of the present invention.

Referring to FIG. 2, the CMOS image sensor includes photodiodes 102, a first planarization layer 103, R, G, B color filter layers 104, 105, and 106, a second planarization layer 107, a hole 108 filled with a light blocking layer 109, and a plurality of microlenses 110. In a specific embodiment, at least one photodiode 102 can be formed in the surface of a semiconductor substrate 101 to generate electric charges according to an amount of incident light. The first planarization layer 103 can be formed on an entire surface of the semiconductor substrate 101 having the photodiodes 102. The R, G, B color filter layers 104, 105, and 106 can be formed on the first planarization layer 103 to correspond to each of the photodiodes 102. The color filter layers 104, 105, and 106 can be spaced apart from each other by a predetermined interval. The second planarization layer 107 can be formed in a convex shape on the semiconductor substrate 101 having the R, G, B color filter layers 104, 105, and 106. The hole 108 can be formed in the second planarization layer 107 to expose a predetermined portion between each of the color filter layers 104, 105, and 106. The light blocking layer 109 can be formed of an opaque metal filling the hole 108. The plurality of microlenses can be formed on the second planarization layer 107, each in a convex shape having a predetermined curvature to correspond to each of the R, G, B color filter layers 104, 105, and 106.

As illustrated in FIG. 2, the plurality of microlenses 110 is formed on the convex second planarization layer 107.

A method for manufacturing the CMOS image sensor illustrated in FIG. 2 will be described in detail with reference to FIGS. 3A to 3F.

FIGS. 3A to 3F are sectional views illustrating a method for manufacturing a CMOS image sensor according to an embodiment of the present invention.

Figure 3A:
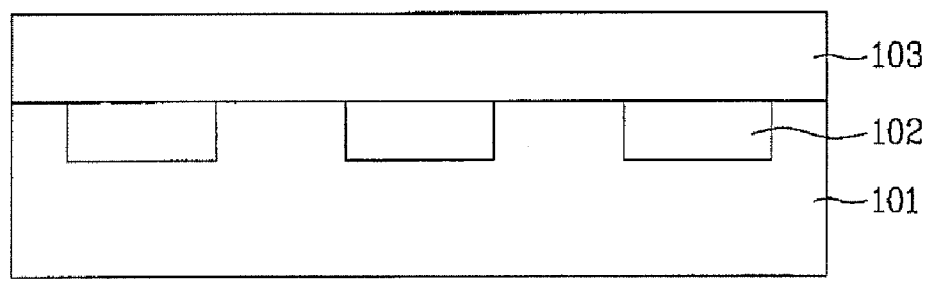
FIGS. 3A to 3F are sectional views illustrating a method for manufacturing a CMOS image sensor according to an embodiment of the present invention.

Referring to FIG. 3A, a plurality of photodiodes 102 can be formed in the surface of a semiconductor substrate 101 for generating electric charges according to an amount of incident light. An inter-layer insulation layer (not shown) and a first planarization layer 103 can be formed on entire surface of the semiconductor substrate 101 having the photodiodes 102.

In one embodiment, the inter-layer insulation layer can be a multi-layer. Although not shown in the figures, after forming one inter-layer insulation layer, a light blocking layer can be formed to prevent light from being incident into a portion not having the intended photodiode 102, and then another inter-layer insulation layer can be formed thereupon.

Figure 3B:
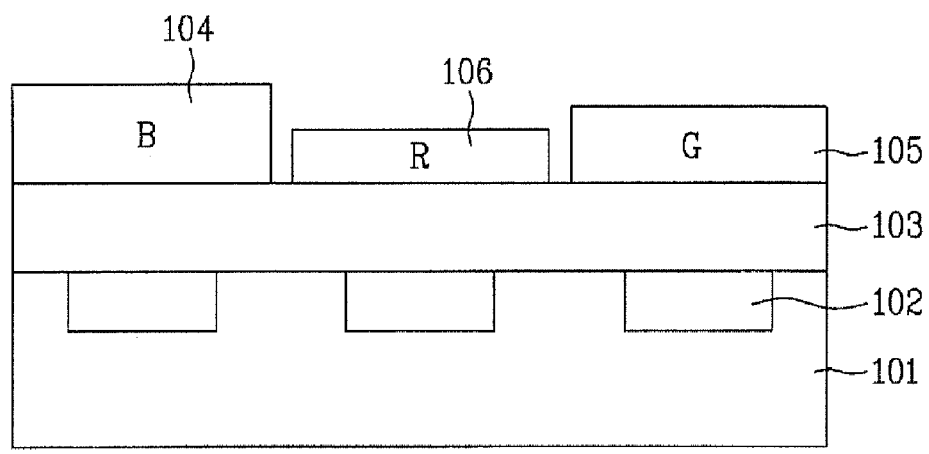

Next, referring to FIG. 3B, a blue color filter layer 104 can be formed by applying a resist for a blue color filter on the first planarization layer 103, and then performing exposure and development processes.

A green color filter layer 105 can be formed by applying a resist for a green color filter on the semiconductor substrate 101 having the blue color filter layer 104, and performing exposure and development processes. Here, the green color filter layer 105 and the blue color filter layer 104 have a predetermined interval therebetween.

Then, a red color filter layer can be formed by applying a resist for a red color filter on the semiconductor substrate 101 having the blue and green color filters 104 and 105, and performing exposure and development processes. Here, a predetermined interval between the blue, green, red color filter layers 104, 105, and 106 is formed.

The blue color filter layer 104, the green color filter layer 105, and the red color filter layer 106 are sequentially formed in the embodiment described above. However, embodiments of the present invention are not limited to this order such that the formation order of each of the color filter layers 104, 105, and 106 can be arbitrarily adjusted.

Figure 3C:
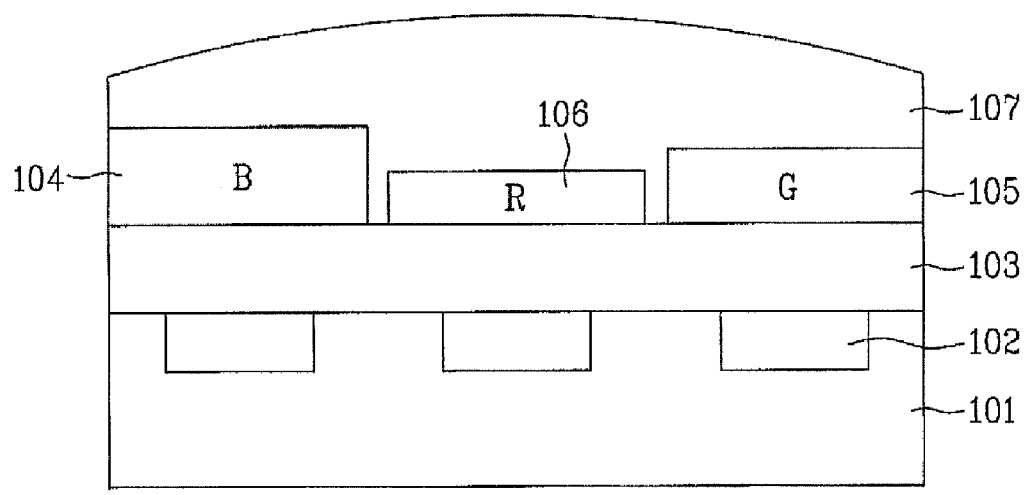

Next, as illustrated in FIG. 3C, a second planarization layer 107 can be formed to adjust the focal length and to form a lens layer on the semiconductor substrate 101 having color filter layers 104, 105, and 106.

In an embodiment, a second planarization layer 107 can be formed, and a photosensitive layer (not shown) can be applied on the second planarization layer 107. Then, exposure and developing processes can be performed for patterning the photosensitive layer.

Next, the patterned photosensitive layer can be reflowed at a predetermined temperature to have a convex rounding surface. In a specific embodiment, the predetermined temperature can be 150~200° C.

The convex rounded photosensitive layer and the second planarization layer 107 can be etched using a 1:1 etching selectivity such that the surface of the second planarization layer 107 is formed having a convex shape.

Figure 3D:
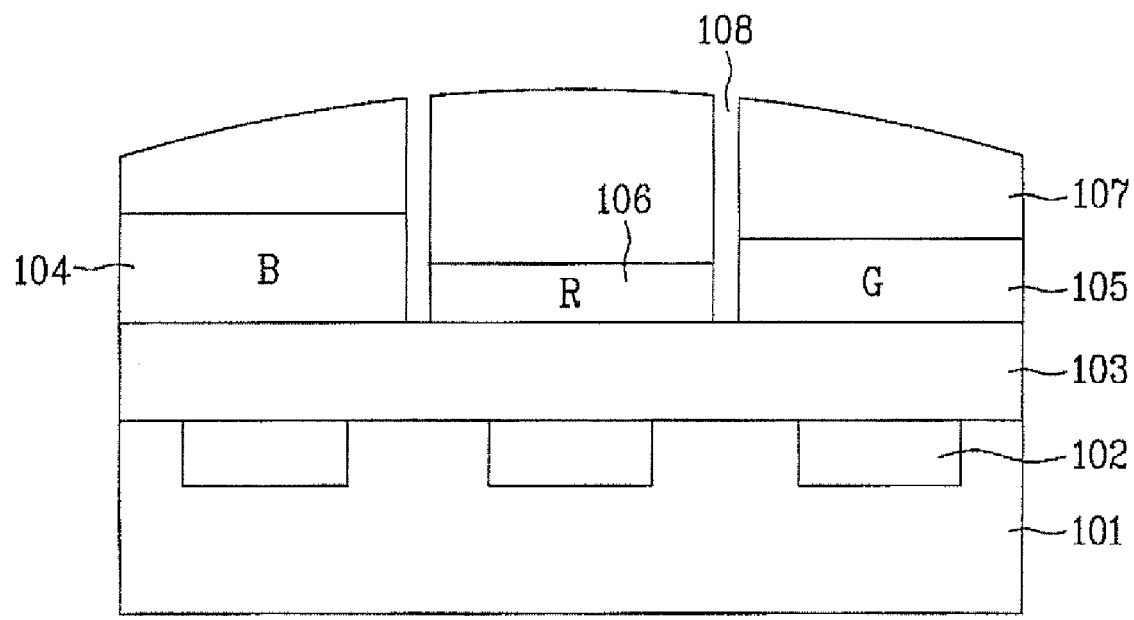

Next, as illustrated in FIG. 3D, the convex shaped second planarization layer 107 can be selectively removed to form a hole 108. The hole 108 can expose the spaces between the color filters 104, 105, and 106.

That is, space between each of color filters 104, 105, and 106 is completely opened by the hole 108.

Figure 3E:
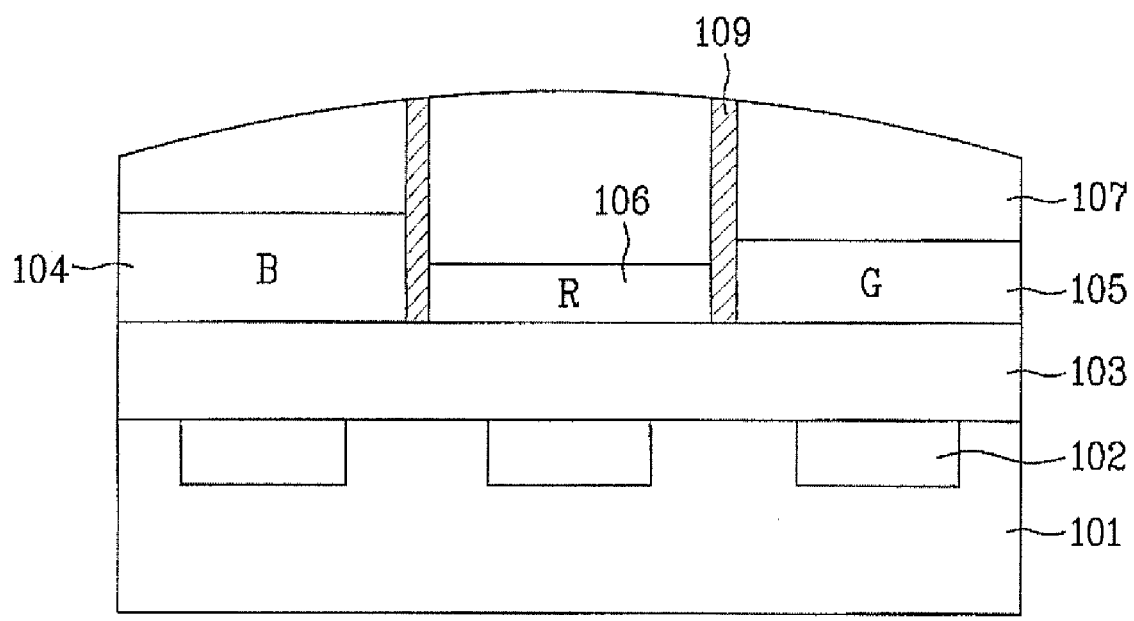

Next, as illustrated in FIG. 3E, an opaque metal can be deposited on an entire surface of the semiconductor substrate 101 having the hole 108.

Next, an etch-back can be performed to make metal deposited inside the hole 108 remain while removing the metal on a surface of the substrate. In another embodiment, a chemical mechanical polishing (CMP) process can be used. The metal remaining inside the hole 108 serves as a light blocking layer 109.

Here, the light blocking layer 109 may be formed to completely seal the hole 108 between each of the color filters 104, 105, and 106.

Figure 3F:
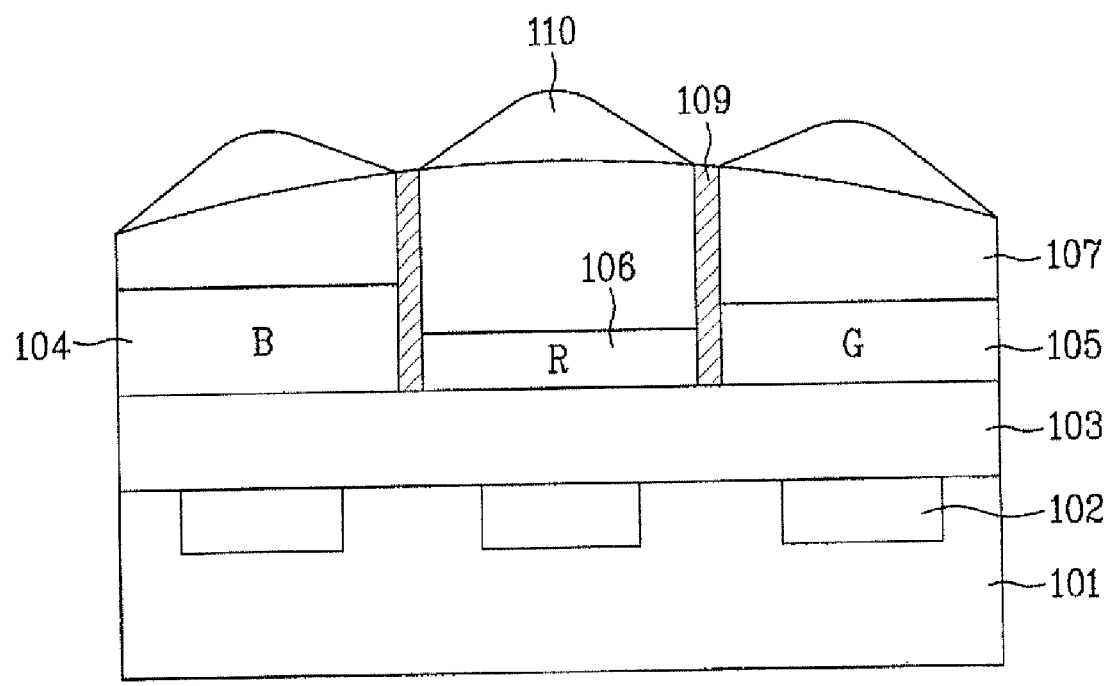

Next, as illustrated in FIG. 3F, a material layer for forming microlens can be applied on the entire surface of the semiconductor substrate 101, and then exposure and developing processes can be performed to form a microlens pattern.

In a specific embodiment, the material layer for forming microlens can be a resist or an oxide layer such as Tetra Ethyl Ortho Silicate (TEOS).

Then, the microlens pattern can be reflowed at a temperature of 150 to 300° C. to form the microlens 110.

In a specific embodiment, the reflow process may be performed by using a hot plate or furnace.

Then, the microlens 110 can be hardened by projecting ultraviolet rays onto its surface.

Figure 4:
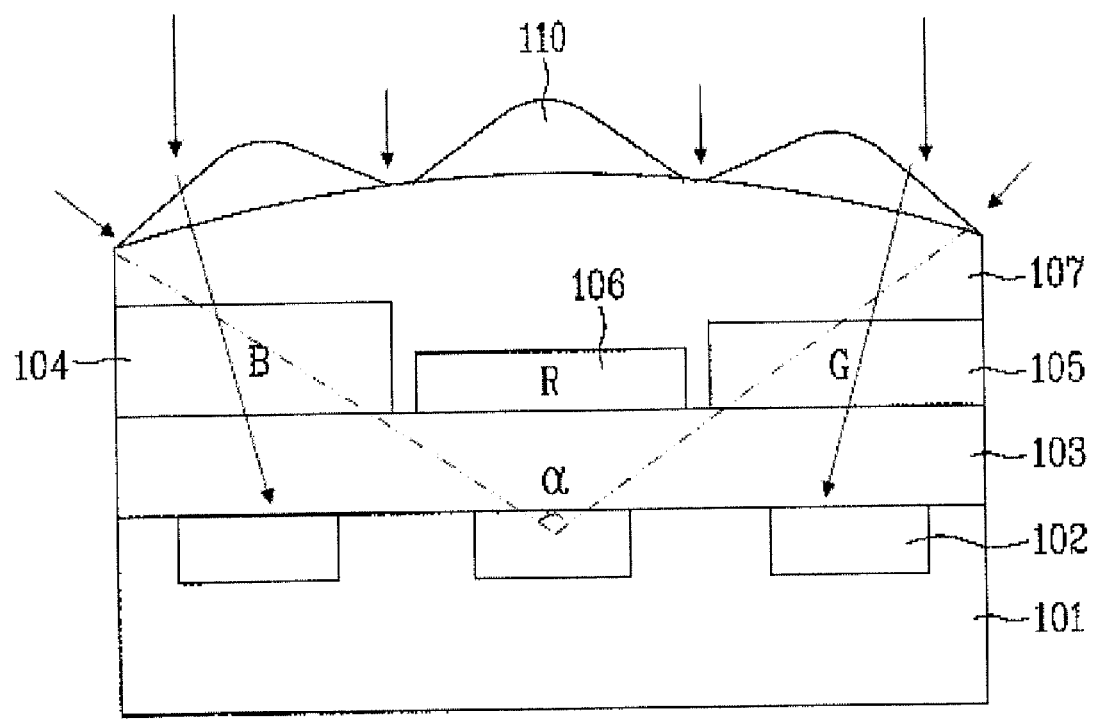
FIG. 4 is a sectional view of a CMOS image sensor according to a second embodiment of the present invention.

FIG. 4 is a sectional view of a CMOS image sensor according to a second embodiment of the present invention.

The second embodiment can be identical to the first embodiment except that the light blocking layer is not formed in the second embodiment.

Referring to FIG. 4, the CMOS image sensor can include photodiodes 102, a first planarization layer 103, R, G, B color filter layers 104, 105, and 106, a second planarization layer 107, and a plurality of microlenses 110. In particular, at least one photodiode 102 can be formed in the surface of a semiconductor substrate 101 to generate electric charges according to an amount of incident light. The first planarization layer 103 can be formed on the entire surface of the semiconductor substrate 101 having the photodiodes 102. The R, G, B color filter layers 104, 105, and 106 can be formed on the first planarization layer 103 to correspond to each of photodiodes 102. The second planarization layer 107 can be formed in a convex form on the entire surface of the semiconductor substrate 101 having the R, G, B color filter layer 14. The plurality of microlenses can be formed on the second planarization layer 107 to correspond to each of the R, G, B color filter layers 104, 105, and 106.

Similar to the first embodiment, the diameter of the microlens 110 shown in the second embodiment becomes longer as compared to the related art plane surfaced second planarization layer 107 by forming the second planarization layer 107 to have a convex surface. When the diameter of the microlens 110 increases, an area of real image that can be captured increases.

A method for manufacturing the CMOS image sensor according to the second embodiment can be identical to that of the first embodiment except for the process of forming the hole and the light blocking layer described in the first embodiment.

As described above, the area of a real image that can be captured increases as compared to the related art microlens formed on the plane surfaced second planarization layer by forming the microlens 110 on a convex surfaced second planarization layer 107 (i.e., the value a shown in FIG. 4 increases as compared to the related art).

Additionally, noise due to natural light can be prevented by forming the light blocking layer 109 between each of the color filters 104, 105, and 106. As a result, sensitivity characteristics of the image sensor can be improved.

It will be apparent to those skilled in the art that various modifications and variations can be made in the present invention.

Thus, it is intended that the present invention covers the modifications and variations of this invention provided they come within the scope of the appended claims and their equivalents.

I claim:

1. A complementary metal oxide semiconductor (CMOS) image sensor comprising:
    a plurality of photodiodes formed in the surface of a semiconductor substrate;
    a first planarization layer formed on the semiconductor substrate having the photodiodes;
    color filter layers formed on the first planarization layer corresponding to the plurality of photodiodes, the color filter layers being spaced apart from each other by a predetermined interval;
    a second planarization layer formed in a convex shape on the semiconductor substrate having the color filter layers;
    a light blocking layer formed in the second planarization layer between each of the color filter layers, the light blocking layer formed from the top surface of the second planarization layer to the bottom surface of the second planarization layer; and
    a plurality of microlenses formed on the second planarization layer corresponding to the color filter layers.

2. The CMOS image sensor according to claim 1, wherein the light blocking layer is formed of opaque metal.

3. The CMOS image sensor according to claim 1, further comprising an inter-layer insulation layer formed between the semiconductor substrate and the first planarization layer.

4. The CMOS image sensor according to claim 1, wherein the color filter layers comprise a blue color filter layer, a green color filter layer and a red color filter layer; and
    the light blocking layer formed between the blue color filter layer, the green color filter layer and the red color filter layer, respectively.

* * * * *